(12) United States Patent
Miyagawa

(10) Patent No.: US 6,617,625 B2
(45) Date of Patent: Sep. 9, 2003

(54) SOLID STATE IMAGER

(75) Inventor: Ryohei Miyagawa, Sagamihara (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/886,993

(22) Filed: Jun. 25, 2001

(65) Prior Publication Data

US 2001/0054713 A1 Dec. 27, 2001

(30) Foreign Application Priority Data

Jun. 26, 2000 (JP) ........................................ 2000-191321

(51) Int. Cl.⁷ .............................................. H01L 31/062
(52) U.S. Cl. ....................................... 257/290; 257/288
(58) Field of Search ................................. 287/223, 333, 287/239, 231–233, 435, 461, 396

(56) References Cited

U.S. PATENT DOCUMENTS

| | | | |
|---|---|---|---|
| 4,851,890 A | * | 7/1989 | Miyatake |
| 5,982,011 A | * | 11/1999 | Kalnitsky et al. |
| 6,027,955 A | | 2/2000 | Lee et al. |
| 6,028,330 A | * | 2/2000 | Lee et al. |
| 6,051,857 A | * | 4/2000 | Miida |
| 6,107,655 A | * | 8/2000 | Guidash |
| 6,140,670 A | * | 10/2000 | Chang |
| 6,153,907 A | * | 11/2000 | Huang et al. |
| 6,177,293 B1 | * | 1/2001 | Netzer et al. |

FOREIGN PATENT DOCUMENTS

| | | |
|---|---|---|
| JP | 62-39058 | 8/1985 |
| JP | 8-335688 | 4/1995 |
| JP | 10-098176 | 4/1998 |
| JP | 10-150182 | 6/1998 |
| KR | 87-2720 | 4/1987 |

* cited by examiner

*Primary Examiner*—Nathan J. Flynn
*Assistant Examiner*—Kevin Quinto
(74) *Attorney, Agent, or Firm*—Oblon, Spivak, McClelland, Maier & Neustadt, P.C.

(57) ABSTRACT

A device region surrounded by a device isolation region has a rectangular shape with a width in a direction in which a gate electrode of a transfer gate extends. A signal accumulation region of a photodiode is disposed on the entirety of that portion of the device region, which is located on a source side of the gate electrode of the transfer gate. A detection section having a width in the direction in which the gate electrode extends is disposed on that portion of the device region, which is located on a drain side of the gate electrode of the transfer gate. The size of the detection section is set to be as small as possible. Two edge portions of the detection section, which are located in the direction of extension of the gate electrode, are spaced apart from the device isolation region.

14 Claims, 8 Drawing Sheets

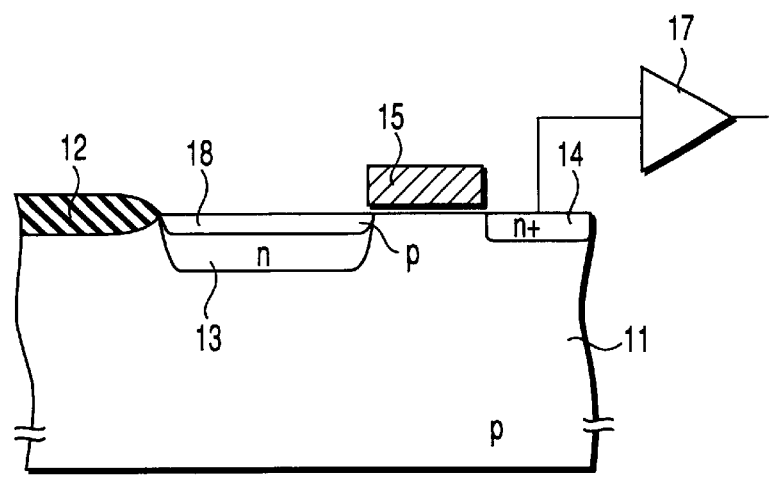
F I G. 17
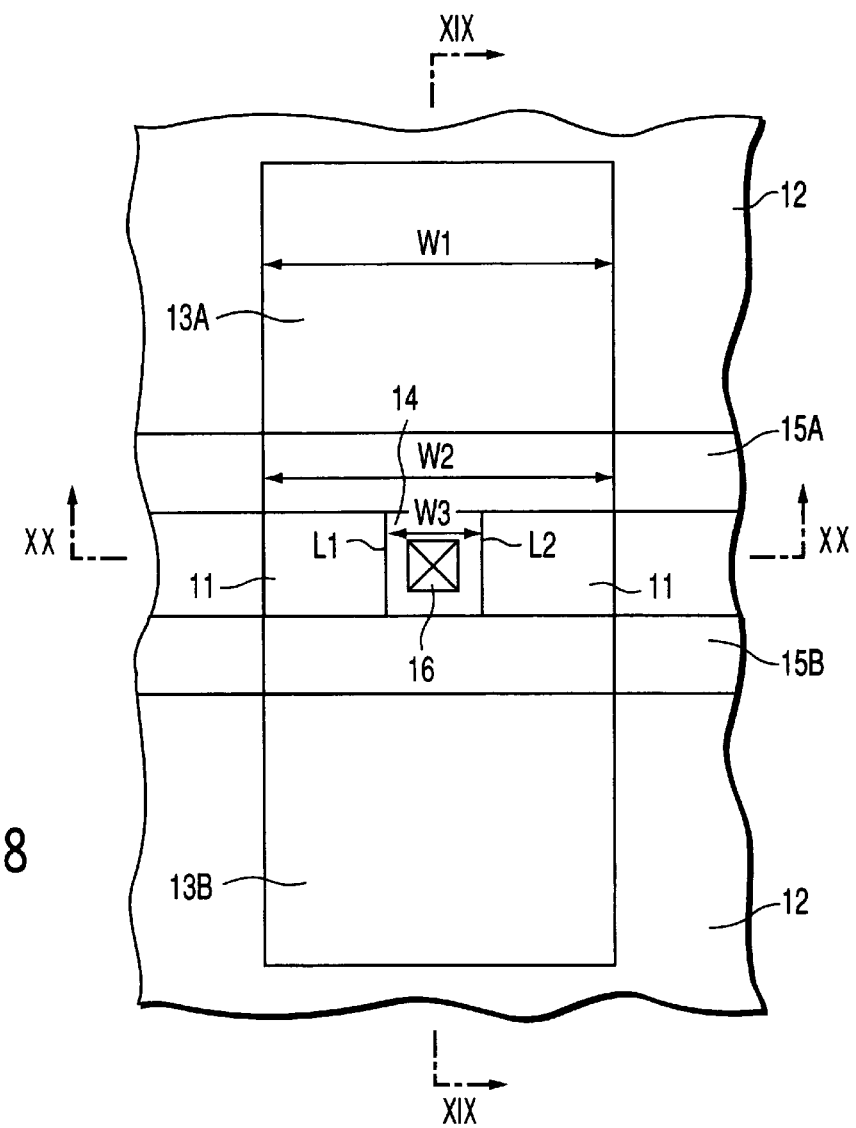
F I G. 18

SOLID STATE IMAGER

CROSS-REFERENCE TO RELATED APPLICATIONS

This application is based upon and claims the benefit of priority from the prior Japanese Patent Application No. 2000-191321, filed Jun. 26, 2000, the entire contents of which are incorporated herein by reference.

BACKGROUND OF THE INVENTION

1. Field of the Invention

The present invention relates to a device structure of a pixel section of a solid state imager.

2. Description of the Related Art

FIG. 1 shows a circuit structure of a pixel section of a sense type solid state imager.

A pixel comprises a photodiode 21 for converting an optical signal to an electric signal (charge); a transfer gate (MOS transistor) 22 for transferring a charge of the photodiode 21 to a detection section (detection node) D; a reset gate (MOS transistor) 23 for resetting the charge (potential) in the detection section D; a sense gate (MOS transistor) 24 for amplifying the potential of the detection section D; and a select gate (MOS transistor) 25 for outputting a potential of a selected pixel.

A charge photoelectrically converted by the photodiode 21 and accumulated in a signal accumulation region over a predetermined time period is transferred to the detection section D via the transfer gate 22. The charge transferred to the detection section D from the photodiode 21 varies the potential of the detection section D. The sense gate 24 amplifies the variation amount of the potential of the detection section D.

FIG. 2 is a plan view showing a prior-art device layout of a photodiode and a transfer gate. FIG. 3 is a cross-sectional view taken along line III—III in FIG. 2, and FIG. 4 is a cross-sectional view taken along line IV—IV in FIG. 2.

A device isolation region 12 is provided on a p-type semiconductor substrate (or p-type well region) 11. In this example, the device isolation region 12 is formed of a field oxide film by LOCOS (Local Oxidation of Silicon). Alternatively, the device isolation region 12 may be formed of an oxide film having, for example, an STI (Shallow Trench Isolation) structure.

A photodiode and a transfer gate are disposed in a device region surrounded by the device isolation region 12.

In this example, the photodiode comprises the p-type semiconductor substrate 11 and an n-type signal accumulation region (impurity diffusion layer) 13 formed in the semiconductor substrate 11. The transfer gate comprises the n-type signal accumulation region 13 and an n$^+$ detection section (detection node) 14, both formed in the p-type semiconductor substrate 11, and a gate electrode 15 formed on a channel region between the signal accumulation region 13 and detection section 14.

The n-type signal accumulation region 13 functions as a cathode of the photodiode and also as a source of the transfer gate. The impurity density in the n-type signal accumulation region 13 is set at a lowest possible level in order to transfer all the charge accumulated by photoelectric conversion in the signal accumulation region 13 to the detection section 14. The detection section 14 is connected to an amplifier circuit 17 (e.g. sense gate 24 in FIG. 1).

In the above-described sense type solid state imager, the less the parasitic capacitance in the detection section 14, the greater the signal potential that is obtained in the detection section 14 relative to a predetermined charge amount accumulated in the signal accumulation region 13. In other words, the less the parasitic capacitance in the detection section 14, the greater the photosensitivity of the image sensor.

It is thus desirable that the detection section 14 be designed with a smallest possible size in order to decrease the parasitic capacitance and to enhance the photosensitivity of the image sensor. On the other hand, it is important that the signal accumulation region 13 be designed with a greatest possible size in order to receive as much as possible light and to generate as much as possible charge by photoelectric conversion.

For these reasons, as shown in FIG. 2, the signal accumulation region 13 of the pixel section of the prior-art solid state imager has a large size, while the detection section 14 has a small size.

As is shown in FIG. 2, in the prior-art solid state imager, the size of the signal accumulation region 13 is increased as much as possible, and the size of the detection section 14 is decreased as much as possible.

The device region is surrounded by the device isolation region 12, and the position and size of the device region are determined by the device isolation region 12. In addition, in this example, the positions and sizes of the signal accumulation region 13 and detection section 14 are also determined by the device isolation region 12. In short, the edge portions (except portions adjoining the channel region) of the signal accumulation region 13 and detection section 14 coincide with the edge portions of the device isolation region 12.

However, the device region is formed of a semiconductor (e.g. silicon) whereas the device isolation region 12 is formed of an insulator (e.g. silicon oxide). The material of the device region and that of the device isolation region 12 are different and, as a matter of course, have different thermal expansion coefficients.

Consequently, when heat is applied in a step of forming the device isolation region 12 or in other steps, thermal stress may occur and crystal defects may be caused in the semiconductor layer (device region) near the device isolation region 12. The crystal defects may lead to a leak current. Such a leak current varies the potential of, in particular, the detection section 14. Thus, a pseudo signal is produced by the leak current, and the stable operation of the solid state imager cannot be ensured.

It is well known that in the photodiode as shown in FIGS. 2–4, a problem arises due to so-called KTC noise (K: Boltzmann's constant; T: absolute temperature; C: capacitance of photodiode). In order to prevent the KTC noise, a p$^+$ surface shield layer may advantageously be formed on the n-type signal accumulation region 13 so that the photodiode may have a buried structure.

Adopting the buried-type photodiode structure, the n-type signal accumulation region 13 with a low impurity density can be completely depleted and all the charge in the signal accumulation region 13 can be completely transferred to the detection section 14. In brief, this structure is advantageous in inactivating a surface defective level of the signal accumulation region 13, suppressing a leak current and reducing KTC noise.

The depletion potential of the buried-type photodiode is determined by a two-dimensional effect. Thus, the peripheral portion of the signal accumulation region 13 has a lower depletion potential than the central portion thereof. Accordingly, as the size of the photodiode (the size of the signal accumulation region 13) decreases, the depletion potential for depleting the entirety of the signal accumulation region 13 becomes lower and all the charge may advantageously be transferred.

However, as mentioned above, the size of the signal accumulation region 13 cannot be decreased in order to receive as much as possible light and to generate as much as possible charge by photoelectric conversion.

The same trade-off problem arises with the channel width of the transfer gate (read gate). As is shown in FIG. 2, the channel width W2 (equal to the dimension in one direction of the detection section 14) of the transfer gate is normally set to be less than the size W1 (i.e. the width in one direction) of the signal accumulation region 13. The reason is that it is advantageous, as mentioned above, to minimize the size of the detection section 14 and to maximize the size of the signal accumulation region 13, thereby to receive as much as possible light and to enhance the photosensitivity of the image sensor as high as possible.

If the channel width W2 of the transfer gate is decreased, however, the width of the charge transfer path from the signal accumulation region 13 to the detection section 14 narrows. As a result, the read-out of the charge becomes difficult, and the charge cannot completely be transferred.

This problem can be overcome if the channel width W2 of the transfer gate is increased. In this case, however, the size of the detection section 14 will inevitably be increased. In short, if the channel width W2 of the transfer gate is increased in order to completely transfer the charge, the size of the detection section 14 increases and the photosensitivity of the image sensor deteriorates.

As has been described above, the first problem in the prior-art solid state imager is as follows. Since all the edge portions of the detection section, except the edge portion on the channel region side, are in contact with the device isolation region, crystal defects which may occur in the peripheral portion of the device isolation region will cause a leak current in the detection section. As a result, a pseudo signal may be produced.

The second problem is as follows. In the prior-art solid state imager, the size of the signal accumulation region of the photodiode is maximized and the size of the detection section is minimized in order to convert as much as possible light to charge and to enhance the photosensitivity. In this case, however, the channel width of the transfer gate is decreased and this is disadvantageous for complete transfer of charge. Moreover, if the channel width of the transfer gate is increased, the size of the detection section increases and the photosensitivity decreases.

BRIEF SUMMARY OF THE INVENTION

An object of the present invention is to suppress a leak current at a detection section due to crystal defects in a peripheral portion of a device isolation region, and another object of the invention is to increase a channel width without involving an increase in size of a detection section, thereby achieving complete transfer of charge and enhancement of photosensitivity at the same time.

The present invention provides a solid state imager comprising: a device isolation region provided on a semiconductor substrate of a first conductivity type; a photoelectric conversion element disposed within a device region surrounded by the device isolation region; and a transfer gate, provided within the device region, for transferring a charge produced by the photoelectric conversion element to a detection section. The detection section is an impurity region of a second conductivity type disposed within the device region, and at least a portion of edge portions of the detection section, which exclude an edge portion adjoining a channel region of the transfer gate, is spaced apart from the device isolation region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 17 is a cross-sectional view showing a device structure of a buried-type photodiode;

FIG. 18 is a plan view showing a fourth embodiment of the solid state imager according to the present invention;

DETAILED DESCRIPTION OF THE INVENTION

A solid state imager of the present invention will be described below in detail with reference to the accompanying drawings.

First Embodiment

Figure 5:
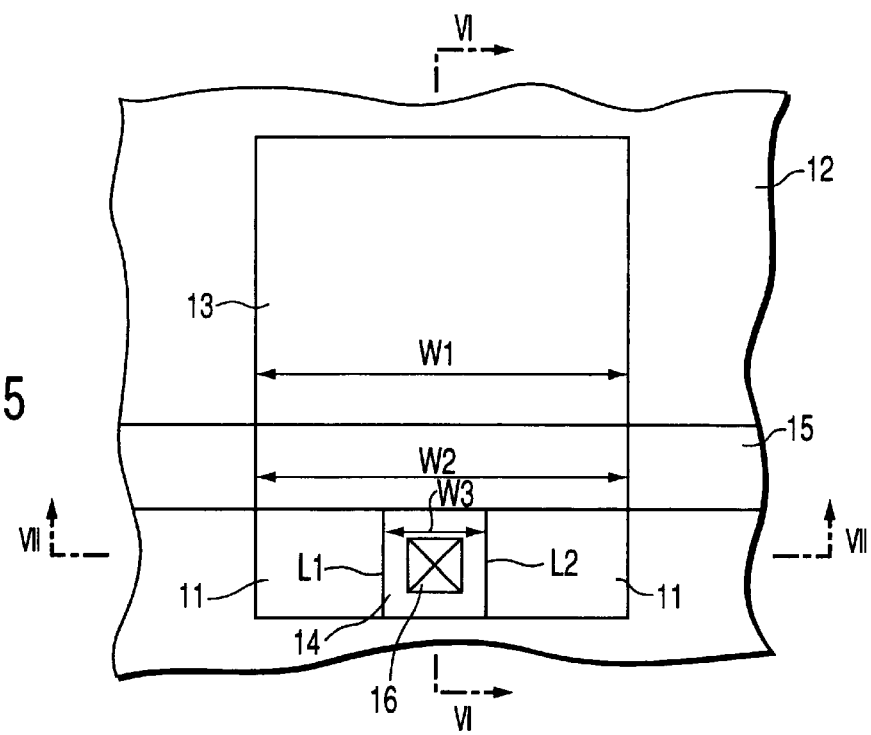
FIG. 5 is a plan view showing a first embodiment of a solid state imager according to the present invention.
Figure 6:
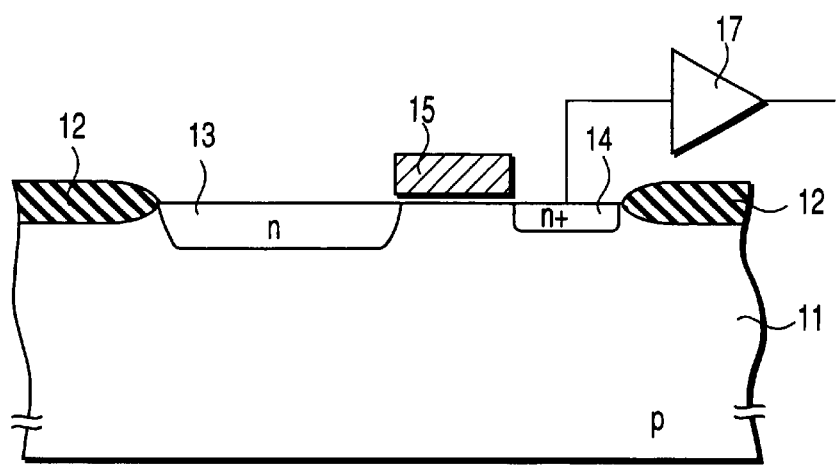
FIG. 6 is a cross-sectional view taken along line VI—VI in FIG. 5.
Figure 7:
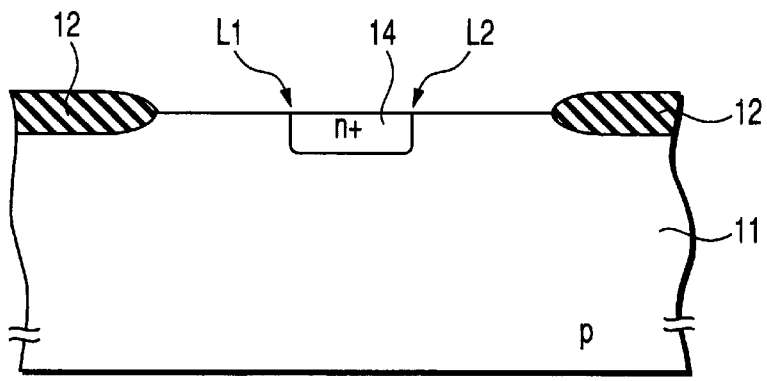
FIG. 7 is a cross-sectional view taken along line VII—VII in FIG. 5.

FIG. 5 shows a first embodiment of a solid state imager according to the present invention. FIG. 6 is a cross-sectional view taken along line VI—VI in FIG. 5, and FIG. 7 is a cross-sectional view taken along line VII—VII in FIG. 5.

A device isolation region 12 is provided on a p-type semiconductor substrate (or p-type well region) 11. In this example, the device isolation region 12 is formed of a field oxide film by LOCOS (Local Oxidation of Silicon). Alternatively, the device isolation region 12 may be formed of an oxide film having, for example, an STI (Shallow Trench Isolation) structure.

A photodiode and a transfer gate are disposed in a device region surrounded by the device isolation region 12.

In this example, the photodiode comprises the p-type semiconductor substrate 11 and an n-type signal accumulation region (impurity diffusion layer) 13 formed in the semiconductor substrate 11. Alternatively, as shown in FIG. 17, a $p^+$ surface shield layer 18 may be formed on the n-type signal accumulation region 13, thereby constituting a buried-type photodiode. The transfer gate comprises the n-type signal accumulation region 13 and an $n^+$ detection section (detection node) 14, both formed in the p-type semiconductor substrate 11, and a gate electrode 15 formed on a channel region between the signal accumulation region 13 and detection section 14.

Figure 1:
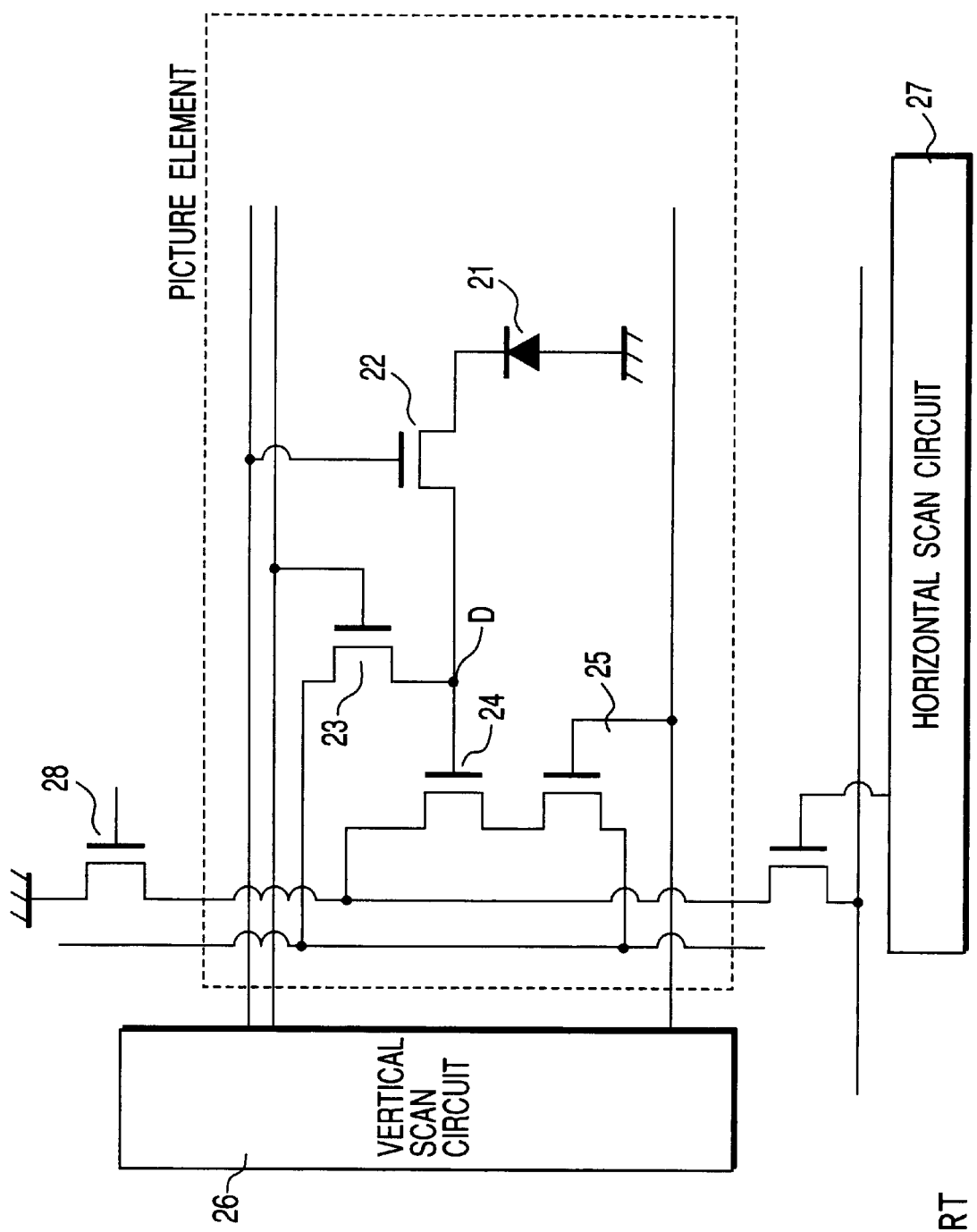
FIG. 1 is a circuit diagram showing a pixel of a conventional solid state imager.

The n-type signal accumulation region 13 functions as a cathode of the photodiode and also as a source of the transfer gate. The impurity density in the n-type signal accumulation region 13 is set at a lowest possible level in order to lower a depletion potential and to transfer all the charge accumulated by photoelectric conversion in the signal accumulation region 13 to the detection section 14. The detection section 14 is connected to an amplifier circuit 17 (e.g. sense gate 24 in FIG. 1).

A first feature of the device structure in this embodiment is that two edge portions L1 and L2 of the detection section 14, which are located in a direction (corresponding to "one direction") in which the gate electrode 15 of the transfer gate (MOS transistor) extends, are spaced apart from the device isolation region 12 (i.e. the edge portions L1 and L2 are not in contact with the device isolation region 12).

In this embodiment, the device region surrounded by the device isolation region 12 has the same width W1 on both sides (source side and drain side) of the gate electrode 15 of the select gate. On the source side of the gate electrode 15, as in the prior art, the signal accumulation region 13 of the photodiode is disposed. On the other hand, the detection section 14 having a smaller width W3 than the width W1 of the device region is disposed on the drain side of the gate electrode 15. As a result, the edge portions of the detection section 14, which are located in the direction of extension of the gate electrode 15, are spaced apart from the device isolation region 12.

Compared to the prior-art device, the device of this embodiment is characterized in that at least one of the edge portions of the detection section 14 which exclude the edge portion adjoining the channel region (or a portion of edge portions of the detection section 14 in a case where the detection section 14 is not rectangular) is spaced apart from the device isolation region 12.

With this structure, the detection section 14 is free from the effect of crystal defects occurring at the peripheral portion of the device isolation region 12, and a leak current occurring at the detection section can be suppressed. Accordingly, a pseudo signal can be prevented and the stable operation of the solid state imager is ensured.

In the present embodiment, the two edge portions L1 and L2 of the detection section 14, which are located in the direction in which the gate electrode 15 extends, are spaced apart from the device isolation region 12. In the present invention, however, it should suffice if at least one of the edge portions of the detection section 14 excluding the edge portion adjoining the channel region (or at least a portion of edge portions of the detection section 14 in a case where the detection section 14 is not rectangular) is spaced apart from the device isolation region 12.

A second feature of the device structure in this embodiment is that the channel width W2 of the transfer gate is greater than the dimension (i.e. a width in one direction) W3 of the detection section 14. For example, the channel width W2 of the transfer gate is set to be equal to the dimension (i.e. a width in one direction) W1 of the signal accumulation region 13 of the photodiode.

Figure 2:
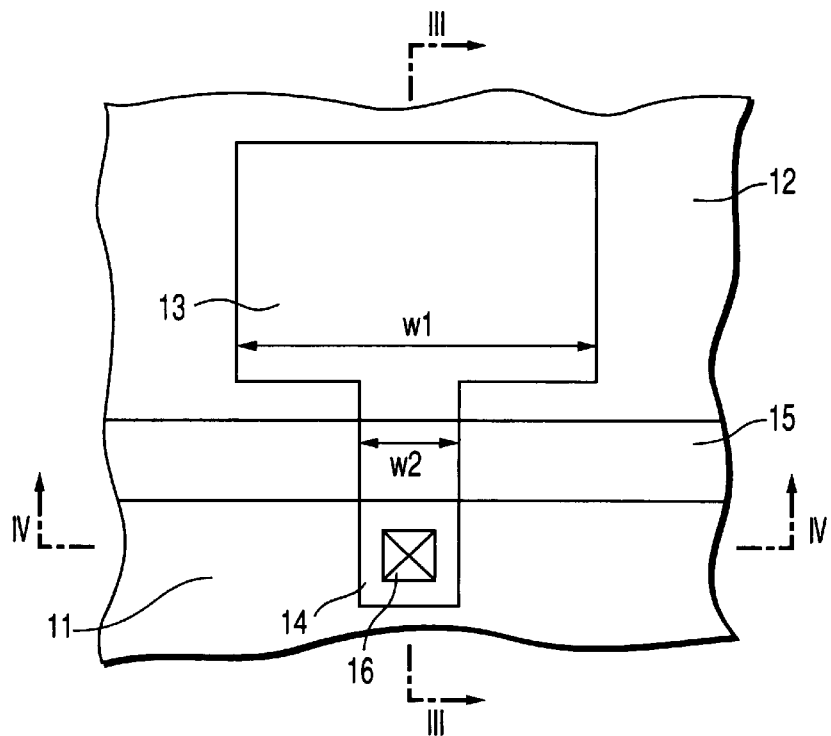
FIG. 2 is a plan view of a conventional solid state imager.
Figure 3:
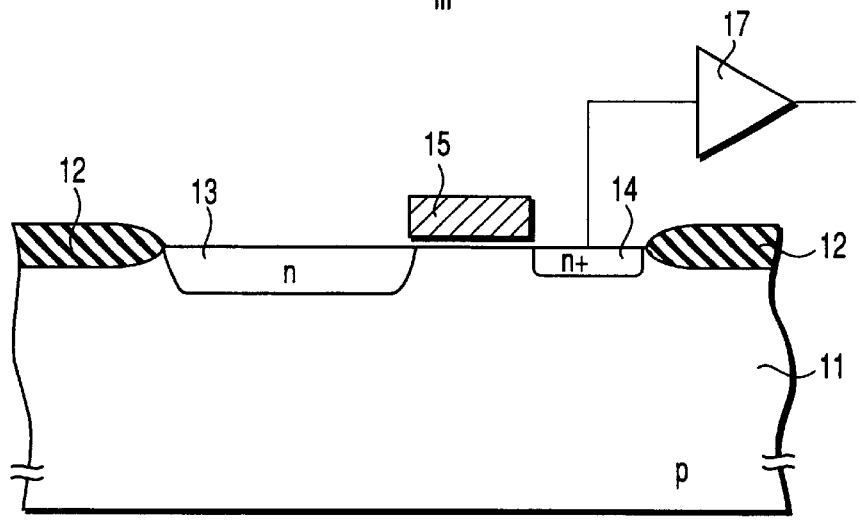
FIG. 3 is a cross-sectional view taken along line III—III in FIG. 2.
Figure 4:
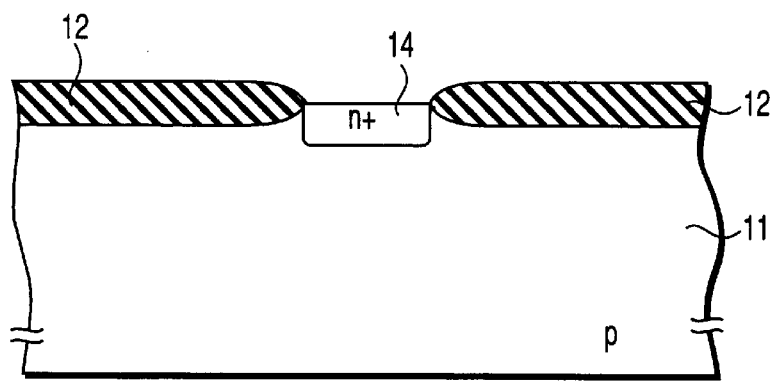
FIG. 4 is a cross-sectional view taken along line IV—IV in FIG. 2.

Specifically, in the prior-art device (see FIG. 2), since the channel width W2 of the transfer gate is set to be equal to the dimension of the detection section 14, the channel width W2 and the dimension of the detection section 14 depend on each other and a trade-off problem occurs between the charge transfer and the photosensitivity. By contrast, according to the device of the present embodiment, the channel width W2 can be freely set irrespective of the dimension W3 of the detection section 14, and such a trade-off problem is solved.

Therefore, according to the device structure of this embodiment, the channel width W2 of the transfer gate can be set, at maximum, at a value equal to the dimension W1 of the signal accumulation region 13 of the photodiode, and all charge can be transferred from the signal accumulation region 13 to the detection section 14. Moreover, even if this structure is adopted, the dimension W3 of the detection section 14 can be set to a minimum and thus the photosensitivity of the image sensor cannot be lowered.

Second Embodiment

A second embodiment of the present invention is a modification of the device structure of the first embodiment. The second embodiment is characterized in that all edge portions L1, L2, L3 and L4 of the detection section 14 are spaced apart from the device isolation region 12.

The device structure according to the second embodiment will now be described in detail.

Figure 8:
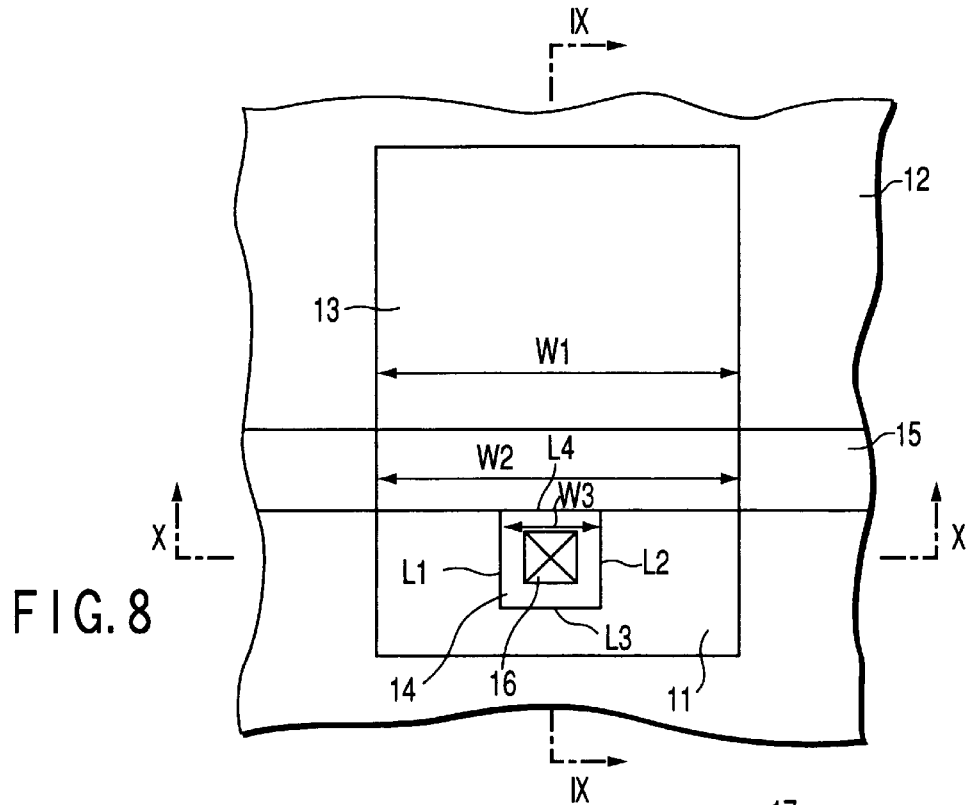
FIG. 8 is a plan view showing a second embodiment of the solid state imager according to the present invention.
Figure 9:
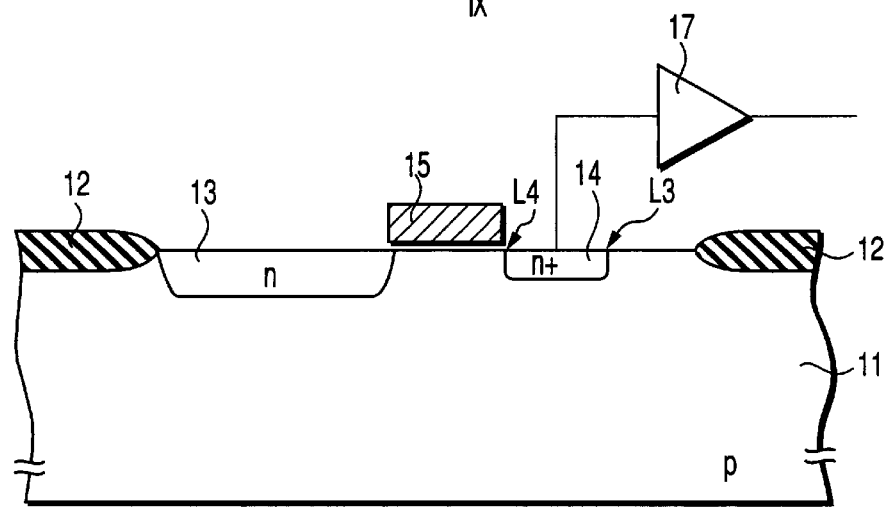
FIG. 9 is a cross-sectional view taken along line IX—IX in FIG. 8.
Figure 10:
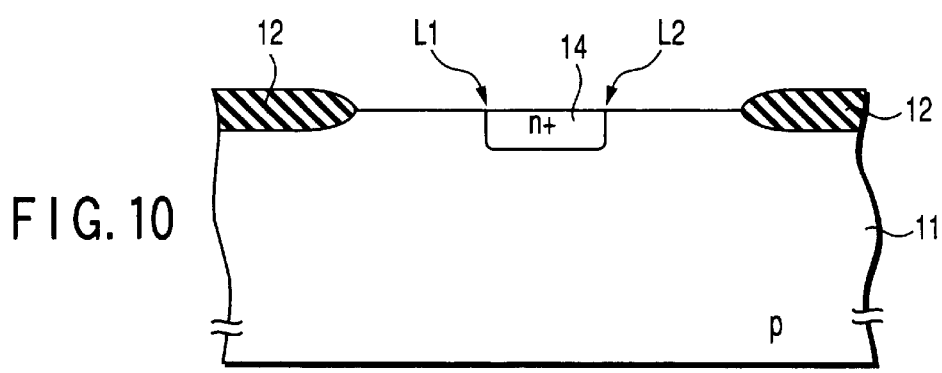
FIG. 10 is a cross-sectional view taken along line X—X in FIG. 8.

FIG. 8 shows the second embodiment of the solid state imager according to the present invention. FIG. 9 is a cross-sectional view taken along line IX—IX in FIG. 8, and FIG. 10 is a cross-sectional view taken along line X—X in FIG. 8.

A device isolation region 12 is provided on a p-type semiconductor substrate (or p-type well region) 11. In this example, the device isolation region 12 is formed of a field oxide film by LOCOS. Alternatively, the device isolation region 12 may be formed of an oxide film having, for example, an STI structure.

A photodiode and a transfer gate are disposed in a device region surrounded by the device isolation region 12.

The photodiode comprises the p-type semiconductor substrate 11 and an n-type signal accumulation region (impurity diffusion layer) 13 formed in the semiconductor substrate 11. Alternatively, as shown in FIG. 17, a p+surface shield layer 18 may be formed on the n-type signal accumulation region 13, thereby constituting a buried-type photodiode. The transfer gate comprises the n-type signal accumulation region 13 and an n+detection section (detection node) 14, both formed in the p-type semiconductor substrate 11, and a gate electrode 15 formed on a channel region between the signal accumulation region 13 and detection section 14.

The n-type signal accumulation region 13 functions as a cathode of the photodiode and also as a source of the transfer gate. The impurity density in the n-type signal accumulation region 13 is set at a lowest possible level in order to lower a depletion potential and to transfer all the charge accumulated by photoelectric conversion in the signal accumulation region 13 to the detection section 14. The detection section 14 is connected to an amplifier circuit 17 (e.g. sense gate 24 in FIG. 1).

A first feature of the device structure in this embodiment is that all edge portions L1, L2, L3 and L4 of the detection section 14 are spaced apart from the device isolation region 12 (i.e. the edge portions are not in contact with the device isolation region 12).

Specifically, in this embodiment, the device region surrounded by the device isolation region 12 has the same width W1 on both sides (source side and drain side) of the gate electrode 15 of the select gate. On the source side of the gate electrode 15, as in the prior art, the signal accumulation region 13 of the photodiode is disposed. On the other hand, the detection section 14 having a smaller width W3 than the width W1 of the device region is disposed on the drain side of the gate electrode 15. In addition, a width of as the detection section 14 in a direction (i.e. "the other direction") perpendicular to a direction (i.e. "one direction") in which the gate electrode 15 extends is less than a dimension in the other direction between the edge portion of the gate electrode 15 and the edge portion of the device isolation region 12.

As a result, all the edge portions of the detection section 14 are spaced apart from the device isolation region 12.

With this structure, the detection section 14 is free from the effect of crystal defects occurring at the peripheral portion of the device isolation region 12, and a leak current occurring at the detection section can be suppressed. Accordingly, a pseudo signal can be prevented and the stable operation of the solid state imager is ensured.

A second feature of the device structure in this embodiment is that the channel width W2 of the transfer gate is greater than the dimension (i.e. a width in "one direction") W3 of the detection section 14. For example, the channel width W2 of the transfer gate is set to be equal to the dimension (i.e. a width in "one direction") W1 of the signal accumulation region 13 of the photodiode.

Specifically, in the prior-art device (see FIG. 2), since the channel width W2 of the transfer gate is set to be equal to the dimension of the detection section 14, the channel width W2 and the dimension of the detection section 14 depend on each other and a trade-off problem occurs between the charge transfer and the photosensitivity. By contrast, according to the device of the present embodiment, the channel width W2 can be freely set irrespective of the dimension W3 of the detection section 14, and such a trade-off problem is solved.

Therefore, according to the device structure of this embodiment, the channel width W2 of the transfer gate can be set, at maximum, at a value equal to the dimension W1 of the signal accumulation region 13 of the photodiode, and all charge can be transferred from the signal accumulation region 13 to the detection section 14. Moreover, even if this structure is adopted, the dimension W3 of the detection section 14 can be set to a minimum and thus the photosensitivity of the image sensor cannot be lowered.

Third Embodiment

A third embodiment of the present invention is a modification of the device structure of the first embodiment. The third embodiment is characterized in that the detection section 14 is disposed at a corner of the rectangular device region, and at least one of the edge portions of the detection section 14, which exclude the edge portion adjoining the channel region, is spaced apart from the device isolation region 12. Specifically, the edge portion L1 of the two edge portions located in the direction of extension of the gate electrode 15 is separated from the device isolation region 12.

The device structure according to the present embodiment will now be described in detail.

Figure 11:
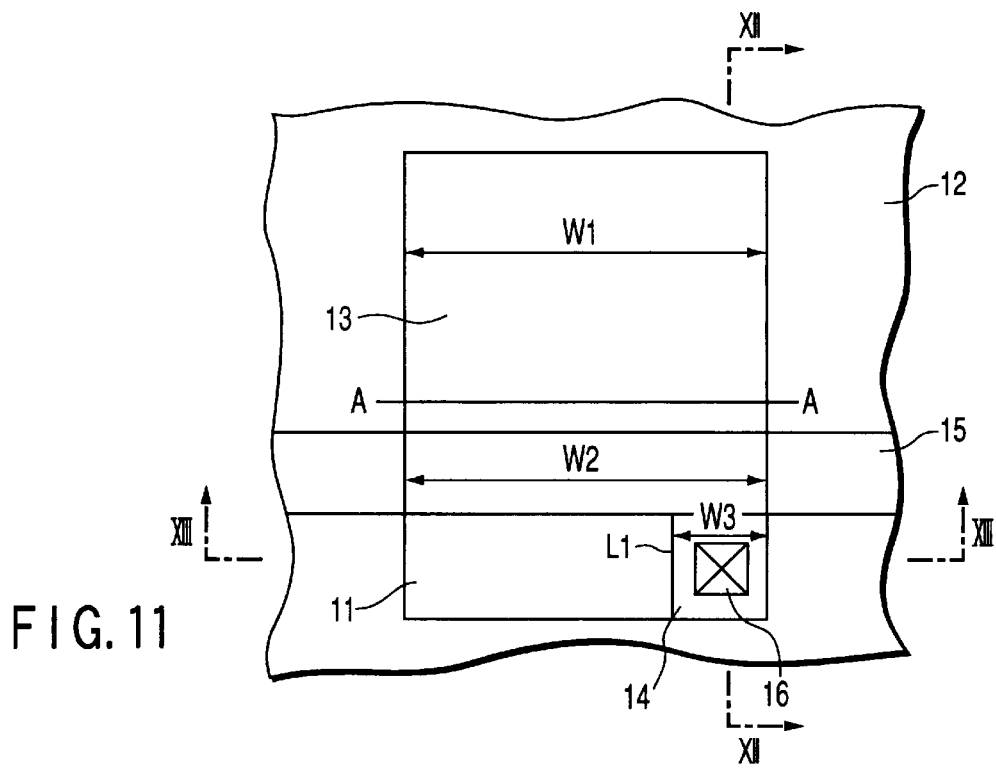
FIG. 11 is a plan view showing a third embodiment of the solid state imager according to the present invention.
Figure 12:
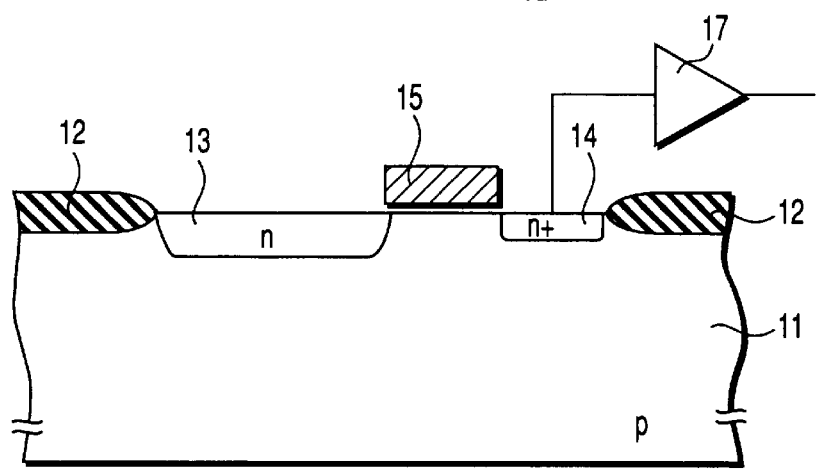
FIG. 12 is a cross-sectional view taken along line XII—XII in FIG. 11.
Figure 13:
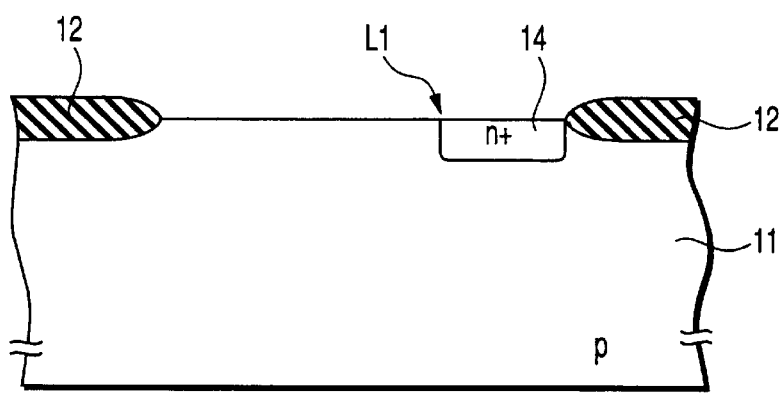
FIG. 13 is a cross-sectional view taken along line XIII—XIII in FIG. 11.

FIG. 11 shows the third embodiment of the solid state imager according to the present invention. FIG. 12 is a cross-sectional view taken along line XII—XII in FIG. 11, and FIG. 13 is a cross-sectional view taken along line XIII—XIII in FIG. 11.

A device isolation region 12 is provided on a p-type semiconductor substrate (or p-type well region) 11. In this example, the device isolation region 12 is formed of a field oxide film by LOCOS. Alternatively, the device isolation region 12 may be formed of an oxide film having, for example, an STI structure.

A photodiode and a transfer gate are disposed in a device region surrounded by the device isolation region 12.

The photodiode comprises the p-type semiconductor substrate 11 and an n-type signal accumulation region (impurity diffusion layer) 13 formed in the semiconductor substrate 11. Alternatively, as shown in FIG. 17, a p+surface shield layer 18 may be formed on the n-type signal accumulation region 13, thereby constituting a buried-type photodiode. The transfer gate comprises the n-type signal accumulation region 13 and an n+detection section (detection node) 14, both formed in the p-type semiconductor substrate 11, and a gate electrode 15 formed on a channel region between the signal accumulation region 13 and detection section 14.

The n-type signal accumulation region 13 functions as a cathode of the photodiode and also as a source of the transfer gate. The impurity density in the n-type signal accumulation region 13 is set at a lowest possible level in order to lower a depletion potential and to transfer all the charge accumulated by photoelectric conversion in the signal accumulation region 13 to the detection section 14. The detection section 14 is connected to an amplifier circuit 17 (e.g. sense gate 24 in FIG. 1).

A first feature of the device structure in this embodiment is that at least one of the edge portions of the detection section 14 which exclude the edge portion adjoining the channel region (or at least a portion of the edge portions of the detection section 14 in a case where the detection section 14 is not rectangular) is spaced apart from the device isolation region 12. With this structure, the detection section 14 is free from the effect of crystal defects occurring at the peripheral portion of the device isolation region 12, and a leak current occurring at the detection section can be suppressed. Accordingly, a pseudo signal can be prevented and the stable operation of the solid state imager is ensured.

A second feature of the device structure in this embodiment is that the channel width W2 of the transfer gate can be freely set irrespective of the dimension W3 of the detection section 14. For example, the dimension W3 of the detection section 14 can be decreased as much as possible and the channel width W2 of the transfer gate can be set at a value equal to the dimension W1 of the signal accumulation region 13 of the photodiode. Accordingly, charge can completely be transferred from the signal accumulation region 13 to the detection section 14, and the photosensitivity of the image sensor cannot be lowered.

A new problem arises with the device structure of the third embodiment, in particular, in the case of the buried-type (or complete-transfer-type) photodiode (see FIG. 17).

The depletion potential of the signal accumulation region 13 of the photodiode in a cross section taken along line A—A in FIG. 11 will be examined below. In normal cases, in a pixel section and its peripheral portion of a solid state imager, electric force lines spread to the device isolation region 12. As a result, the depletion potential of the photodiode decreases due to a so-called narrow channel effect.

For example, in the device shown in FIGS. 11 to 13, too, a channel potential decreases due to a narrow channel effect in that end portion ("end portion of channel region") of the channel region just below the gate electrode 15 of the transfer gate, which is located near the device isolation region 12. Consequently, in this end portion of the channel region, the channel potential does not reach a high depletion potential level at the central portion of the photodiode, and charge cannot completely be transferred.

In order to solve this problem, there is an idea of applying a higher potential to the gate electrode of the transfer gate. In this case, however, a booster circuit needs to be added in order to produce the high potential, or a sufficient gate breakdown voltage cannot be maintained due to the high potential.

Thus, in order to solve the problem of the decrease in depletion potential at the end portion of the channel region due to the narrow channel effect, it is preferable to dispose the detection section 14 at the central portion of the transfer gate where the potential of the photodiode takes a maximum value, as in the devices of the first and second embodiments.

Figure 14:
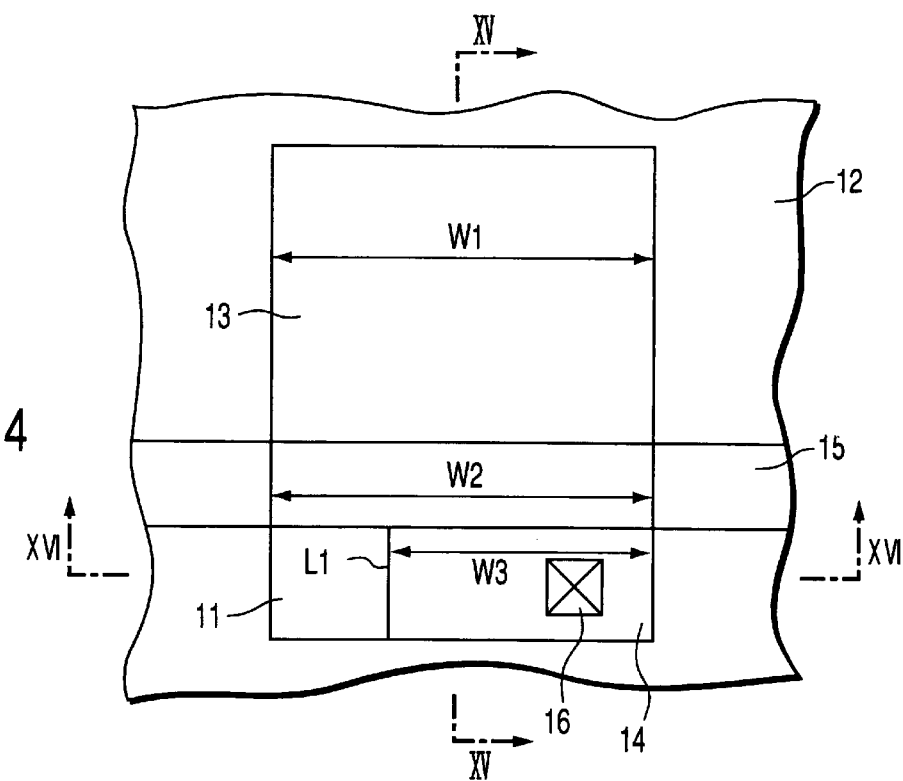
FIG. 14 is a plan view showing a modification of the third embodiment of the solid state imager according to the present invention.
Figure 15:
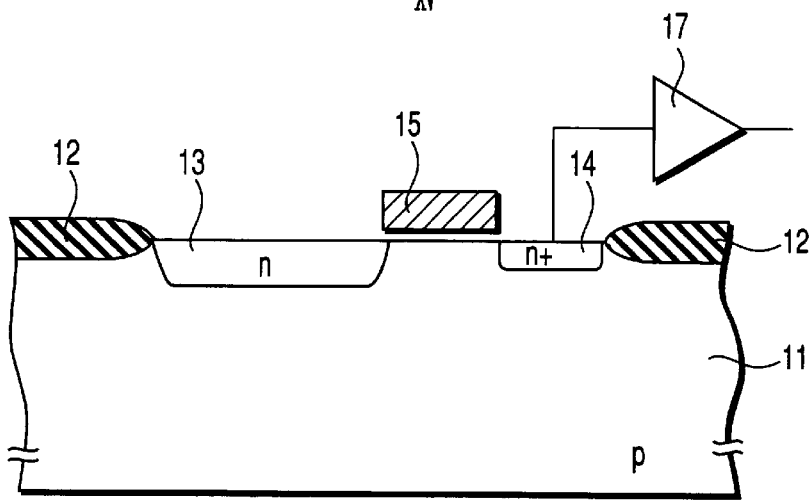
FIG. 15 is a cross-sectional view taken along line XV—XV in FIG. 14.
Figure 16:
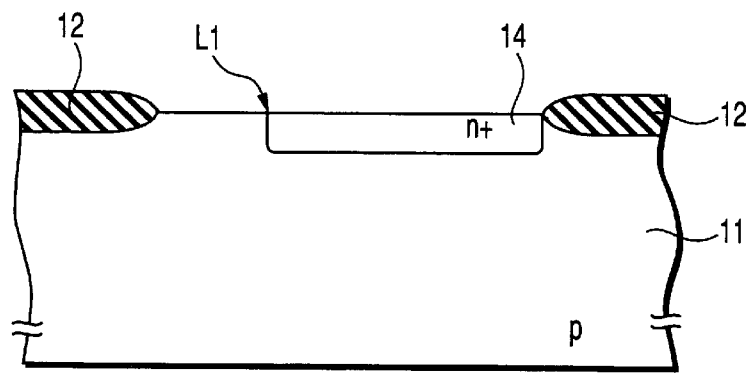
FIG. 16 is a cross-sectional view taken along line XVI—XVI in FIG. 14.

It is possible to adopt a device structure as shown in FIGS. 14 to 16, which is a modification of the device structure shown in FIGS. 11 to 13.

FIG. 14 is a plan view showing this modified device structure according to the present invention. FIG. 15 is a cross-sectional view taken along line XV—XV in FIG. 14, and FIG. 16 is a cross-sectional view taken along line XVI—XVI in FIG. 14.

In the device structure shown in FIGS. 14 to 16, the edge portion L1 of the detection section 14 is made closer to the edge portion of the device isolation region 12, which is located in the direction of extension of the gate electrode 15, so that the detection section 14 may be disposed at the central portion (with maximum potential) of the transfer gate. In this case, too, the edge portion L1 of the detection section 14, of course, does not come in contact with the device isolation region 12.

According to the device structure shown in FIGS. 14 to 16, the size of the detection section 14 is somewhat increased. However, since the detection section 14 is disposed at the central portion of the transfer gate where the potential takes a maximum value, the adverse effect of the narrow channel effect can be suppressed to a minimum and the charge can completely be transferred. Moreover, since the edge portion L1 of the detection section 14 does not come in contact with the device isolation region 12, the occurrence of a pseudo signal due to leak current can be suppressed.

Fourth Embodiment

A fourth embodiment of the present invention is an improvement of the device structure of the first embodiment. The fourth embodiment is characterized in that one detection section is provided for two photodiodes (photoelectric conversion sections), and the size of the pixel is reduced. As regards the detection section, like the first embodiment, two edge portions L1 and L2, which are located in a direction (corresponding to "one direction") in which gate electrodes of transfer gates extend, are spaced apart from the device isolation region 12.

The device structure according to the present embodiment will now be described in detail.

Figure 19:
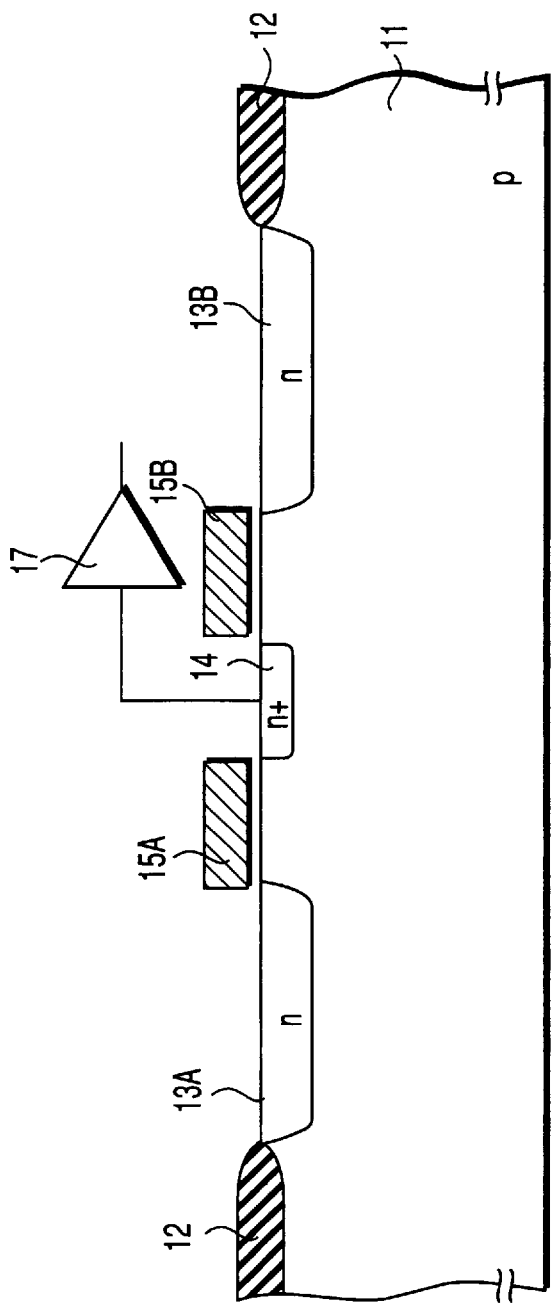
FIG. 19 is a cross-sectional view taken along line XIX—XIX in FIG. 18.
Figure 20:
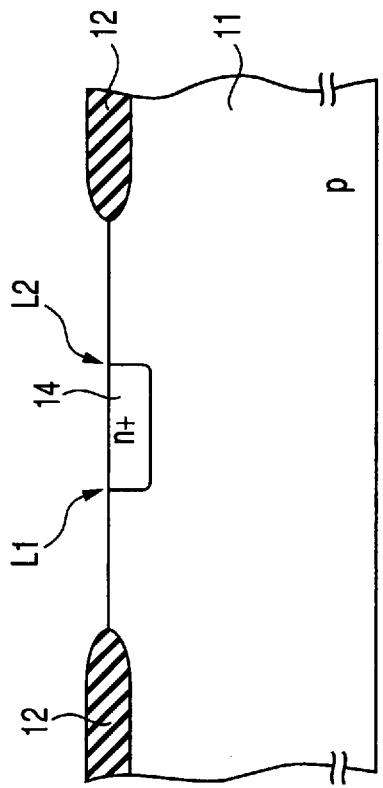
FIG. 20 is a cross-sectional view taken along line XX—XX in FIG. 18.

FIG. 18 shows the fourth embodiment of the solid state imager according to the present invention. FIG. 19 is a cross-sectional view taken along line XIX—XIX in FIG. 18, and FIG. 20 is a cross-sectional view taken along line XX—XX in FIG. 18.

A device isolation region 12 is provided on a p-type semiconductor substrate (or p-type well region) 11. In this example, the device isolation region 12 is formed of a field oxide film by LOCOS. Alternatively, the device isolation region 12 may be formed of an oxide film having, for example, an STI structure.

Two photodiodes (photoelectric conversion sections) and two transfer gates are disposed in a device region surrounded by the device isolation region 12.

The photodiodes are composed of the p-type semiconductor substrate 11 and n-type signal accumulation regions (impurity diffusion layers) 13A and 13B formed in the semiconductor substrate 11. Alternatively, as shown in FIG. 17, buried-type photodiodes may be employed as the photodiodes. The transfer gates are composed of the n-type signal accumulation regions 13A and 13B and an n$^+$detection section (detection node) 14, which are formed in the p-type semiconductor substrate 11, and gate electrodes 15A and 15B formed on channel regions between the signal accumulation regions 13A and 13B, on the one hand, and detection section 14, on the other hand.

The n-type signal accumulation regions 13A and 13B function as cathodes of the photodiodes and also as sources of the transfer gates. The impurity density in each of the n-type signal accumulation regions 13A and 13B is set at a lowest possible level in order to lower a depletion potential and to transfer all the charge accumulated by photoelectric conversion in the signal accumulation region 13A, 13B to the detection section 14. The detection section 14 is connected to an amplifier circuit 17 (e.g. sense gate 24 in FIG. 1).

Figure 21:
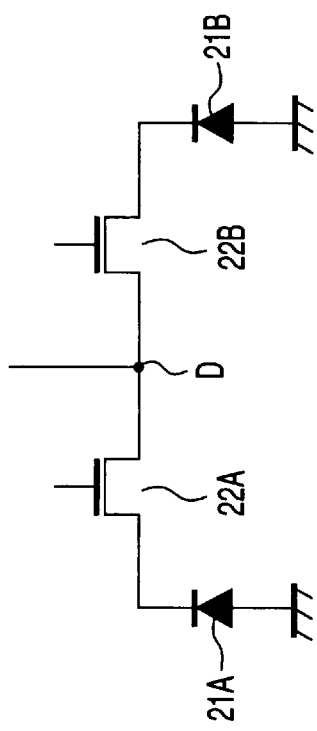
FIG. 21 is a circuit diagram showing an equivalent circuit of the device shown in FIG. 18.

In the device structure of this embodiment, as shown in an equivalent circuit diagram of FIG. 21, a photodiode 21A is connected to a detection section (detection node) D via a transfer gate 22A. Similarly, a photodiode 21B is connected to the detection section (detection node) D via a transfer gate 22B.

A first feature of the device structure in this embodiment is that two edge portions L1 and L2 of the detection section 14, which are located in a direction (corresponding to "one direction") in which the gate electrodes 15A and 15B of the transfer gates (MOS transistors) extend, are spaced apart from the device isolation region 12 (i.e. the edge portions L1 and L2 are not in contact with the device isolation region 12).

In this embodiment, the device region surrounded by the device isolation region 12 has the same width W1 on both sides (source side and drain side) of the gate electrode 15A, 15B of the select gate. On the source side of the gate electrode 15A, 15B, as in the prior art, the signal accumulation region 13A, 13B of the photodiode is disposed. On the other hand, the detection section 14 having a smaller width W3 than the width W1 of the device region is disposed on the drain side of the gate electrode 15A, 15B. As a result, the edge portions of the detection section 14, which are located in the direction of extension of the gate electrode 15A, 15B, are spaced apart from the device isolation region 12.

With this device structure, the detection section 14 is free from the effect of crystal defects occurring at the peripheral portion of the device isolation region 12, and a leak current occurring at the detection section can be suppressed. Accordingly, a pseudo signal can be prevented and the stable operation of the solid state imager is ensured.

A second feature of the device structure in this embodiment is that the channel width W2 of each transfer gate is greater than the dimension (i.e. a width in "one direction") W3 of the detection section 14. For example, the channel width W2 is set to be equal to the dimension (i.e. a width in "one direction") W1 of the signal accumulation region 13A, 13B of each photodiode.

According to this device structure, the channel width W2 can be freely set irrespective of the dimension W3 of the detection section 14. Specifically, the channel width W2 of the transfer gate can be set, at maximum, at a value equal to the dimension W1 of the signal accumulation region 13A, 13B of the photodiode, and all charge can be transferred from the signal accumulation region 13A, 13B to the detection section 14. Moreover, even if this structure is adopted, the dimension W3 of the detection section 14 can be set to a minimum and thus the photosensitivity of the image sensor cannot be lowered.

Advantageous Effects of the Invention

As has been described above, according to the first feature of the solid state imager of the present invention, at least one of the edge portions of the detection section, which exclude the edge portion adjoining the channel region, or at least a portion of the edge portions of the detection section in a case where the detection section is not rectangular, is spaced apart from the device isolation region. With this structure, the detection section is free from the effect of crystal defects occurring at the peripheral portion of the device isolation region, and a leak current occurring at the detection section can be suppressed. Accordingly, a pseudo signal can be prevented and the stable operation of the solid state imager is ensured.

According to the second feature of the solid state imager of the present invention, the channel width can be freely set irrespective of the dimension of the detection section. For example, the channel width of the transfer gate is set to be equal to the dimension (width in "one direction") of the signal accumulation region of the photodiode. Accordingly, all charge can be transferred from the signal accumulation region to the detection section. Moreover, since the dimension of the detection section can be set to a minimum irrespective of the channel width of the transfer gate, the photosensitivity of the image sensor cannot be lowered.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid state imager comprising:
   a semiconductor substrate of a first conductivity type;
   first and second impurity regions of a second conductivity type disposed in the semiconductor substrate, the first impurity region receiving a light signal;
   an isolation region which surrounds the first and second impurity regions; and
   a gate electrode which extends in one direction in an area between the first and second impurity regions;
   wherein at least a portion of edge portions of the second impurity region is spaced apart from the isolation region, and is also spaced apart from a portion located directly under the gate electrode.

2. The solid state imager according to claim 1, wherein the semiconductor substrate and the first impurity region comprise a first photoelectric conversion element.

3. The solid state imager according to claim 1, wherein the first and second impurity regions and the gate electrode comprise a MOS transistor.

4. The solid state imager according to claim 3, wherein a width of the first impurity region in one direction is substantially equal to a channel width of the MOS transistor.

5. The solid state imager according to claim 3, wherein the width of the second impurity region in one direction is substantially less than a channel width of the MOS transistor.

6. The solid state imager according to claim 3, wherein a width of the second impurity region in one direction is substantially less than a width of the first impurity region in one direction.

7. The solid state imager according to claim 1, wherein the first impurity region is disposed on a source side of the gate electrode, and the second impurity region is disposed on a drain side of the gate electrode.

8. The solid state imager according to claim 1, wherein all of the edge portions of the second impurity region are spaced apart from the isolation region.

9. The solid state imager according to claim 1, wherein the first portions of the second impurity region in one direction are spaced apart from the isolation region.

10. The solid state imager according to claim 1, wherein a portion of the edge portions of the second impurity region in a direction of a channel width is spaced apart from the isolation region.

11. The solid state imager according to claim 1, wherein a portion of the edge portions of the second impurity region in a direction orthogonal to a direction of a channel width is spaced apart from the isolation region.

12. The solid state imager according to claim 1, wherein the second impurity region is shared by the first photoelectric conversion element and a second photoelectric conversion element.

13. The solid state imager according to claim 1, wherein the first impurity region is a signal accumulation region.

14. The solid state imager according to claim 13, further comprising a surface shield layer of the first conductivity type disposed on the signal accumulation region.

* * * * *

UNITED STATES PATENT AND TRADEMARK OFFICE
CERTIFICATE OF CORRECTION

PATENT NO. : 6,617,625 B2
DATED : September 9, 2003
INVENTOR(S) : Miyagawa

It is certified that error appears in the above-identified patent and that said Letters Patent is hereby corrected as shown below:

<u>Title page, Item [54] and Column 1, line 1,</u>
The Title information should read -- SOLID STATE IMAGER HAVING REDUCED LEAK CURRENT --

Signed and Sealed this

Eighteenth Day of November, 2003

JAMES E. ROGAN
*Director of the United States Patent and Trademark Office*